(12) United States Patent
Rodder et al.

(10) Patent No.: US 10,008,583 B1
(45) Date of Patent: Jun. 26, 2018

(54) GATE-ALL-AROUND NANOSHEET FIELD-EFFECT TRANSISTORS AND METHODS OF MANUFACTURING THE SAME

(71) Applicant: Samsung Electronics Co., Ltd., Suwon-si, Gyeonggi-do (KR)

(72) Inventors: Mark S. Rodder, Dallas, TX (US); Joon Goo Hong, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days. days.

(21) Appl. No.: 15/683,304

(22) Filed: Aug. 22, 2017

Related U.S. Application Data (60) Provisional application No. 62/503,275, filed on May 8, 2017.

(51) Int. Cl.

| | | |
|---|---|---|
| *H01L 29/76* | (2006.01) | |
| *H01L 29/94* | (2006.01) | |
| *H01L 31/062* | (2012.01) | |
| *H01L 31/113* | (2006.01) | |
| *H01L 31/119* | (2006.01) | |
| *H01L 29/66* | (2006.01) | |
| *H01L 29/786* | (2006.01) | |
| *H01L 29/423* | (2006.01) | |
| *H01L 29/10* | (2006.01) | |
| *H01L 29/417* | (2006.01) | |
| *H01L 29/40* | (2006.01) | |

(52) U.S. Cl.
CPC ...... *H01L 29/6656* (2013.01); *H01L 29/1033* (2013.01); *H01L 29/401* (2013.01); *H01L 29/41733* (2013.01); *H01L 29/42392* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 9,029,834 | B2 | 5/2015 | Bangsaruntip et al. |
| 9,362,355 | B1 | 6/2016 | Cheng et al. |
| 9,647,139 | B2 | 5/2017 | Doris et al. |
| 9,653,289 | B1 | 5/2017 | Balakrishnan et al. |
| 9,748,352 | B2 * | 8/2017 | Liu .................. H01L 29/42392 |

(Continued)

OTHER PUBLICATIONS

Reboh, Shay, et al., "An Analysis of Stress Evolution in Stacked GAA Transistors", Silicon Nanoelectronics Workshop (SNW), 2016 IEEE, Jun. 12-13, 2016, 2 pages.

(Continued)

*Primary Examiner* — Thien F Tran
(74) *Attorney, Agent, or Firm* — Lewis Roca Rothgerber Christie LLP (57) ABSTRACT

A method of manufacturing a gate-all-around (GAA) nanosheet (NS) field effect transistor (FET) includes forming a stack on a substrate. The stack includes an alternating arrangement of conducting channel layers and non-uniform sacrificial regions. Each of the non-uniform sacrificial regions includes upper, middle, and lower sacrificial layers. The upper and lower sacrificial layers are configured to etch at a first etch rate and the middle sacrificial layer is configured to etch at a second etch rate greater than the first etch rate.

9 Claims, 5 Drawing Sheets

(56) References Cited

U.S. PATENT DOCUMENTS

| | | |
|---|---|---|
| 2014/0339611 A1 | 11/2014 | Leobandung |
| 2015/0372104 A1* | 12/2015 | Liu .................. H01L 29/42364 |
| | | 257/77 |
| 2016/0027870 A1* | 1/2016 | Cheng ................. H01L 29/0673 |
| | | 257/347 |
| 2016/0027929 A1* | 1/2016 | Cheng ............... H01L 29/78696 |
| | | 257/9 |
| 2016/0172358 A1 | 6/2016 | Hatcher et al. |
| 2017/0053998 A1 | 2/2017 | Kim et al. |
| 2017/0141207 A1 | 5/2017 | Cheng et al. |

OTHER PUBLICATIONS

Dupre, C., et al., "15nm-diameter 3D Stacked Nanowires with Independent Gates Operation: ΦFET," Electron Devices Meeting, Date of Conference Dec. 15-17, 2008, IEDM 2008, IEEE International, 4 pages.

* cited by examiner

GATE-ALL-AROUND NANOSHEET FIELD-EFFECT TRANSISTORS AND METHODS OF MANUFACTURING THE SAME

CROSS-REFERENCE TO RELATED APPLICATION

The present application claims priority to and the benefit of U.S. Provisional Application No. 62/503,275, filed May 8, 2017 in the U.S. Patent and Trademark Office, the entire contents of which are incorporated herein by reference.

FIELD

The present disclosure relates generally to field-effect transistors and methods of manufacturing the same.

BACKGROUND

Gate-all-around (GAA) nanosheet (NS) field effect transistors (FETs) formed according to conventional methods have an integration difficulty of simultaneously forming source-drain (SD) stressor regions while also achieving low gate-drain capacitance (Cgd). Conventional GAA NS FETs are formed with dielectric internal spacers at the SD boundary. These dielectric internal spacers are conventionally formed after a task of etching to form recesses for SD electrodes, but prior to a task of forming the SD electrodes in the recesses (i.e., dielectric internal spacers are conventionally formed post-SD recess etch and pre-SD epitaxial refill). Accordingly, when the epitaxial SD material is grown to form the SD regions according to these conventional methods, defects form at the dielectric/channel interface, which creates defective SD regions resulting in non-strained SD regions (i.e., no SD stressor regions).

Conventional GAA NS FETs have a further integration difficulty of achieving multiple threshold voltage (mVt) architecture while also achieving low Cgd. Conventional GAA NS FETs are formed by a gate stack (i.e., a dielectric material and a metal) wrapped around each semiconductor channel layer (i.e., each nanosheet channel layer), with the channel layers separated by a vertical spacing (VSP) distance. To achieve mVt integration, the VSP may be increased to more easily enable different metal layers to be formed in the VSP region, which enables different Vt values. However, increasing VSP correspondingly increases Cgd.

Conventional GAA NS FETs have a further integration difficulty of achieving uniform channel layer thickness for wide width channel layers. Conventional GAA NS FETs are formed by an alternating stack of sacrificial layers and channel layers overlying a substrate. During a replacement metal gate (RMG) task, the sacrificial layers are removed selective to the channel layers. The channel layers may be silicon (Si) and the sacrificial layers may be silicon germanium (SiGe) with the Ge % being from approximately 25% to approximately 60%. However, if the Ge % is at the low end of the range (e.g., approximately 25%), the Si channel layers may also be etched during a task of removing the sacrificial layers by an undercut etch process. Etching the Si channel layers results in non-uniform channel layers which do not have the desired electrical properties, such as transport and Vt. For instance, during a conventional task of removing the sacrificial layers, the Si channel layers may also be partially removed (e.g., edges of the Si channel layers may be removed resulting in elliptical-shaped Si channel layers). On the other hand, if the Ge % is at the high end of the range (e.g., approximately 60% or greater), the selectively to Si is increased, but there is more diffusion of Ge into the adjacent channel layers (i.e., forming a broad transition region), such that the channel layers are formed of Si and Ge instead of Si only. Accordingly, providing the sacrificial layers with a Ge % at the high end of the range during conventional GAA NS FET fabrication results in a broad transition region and/or non-uniform channel thickness due to non-uniform diffusion of Ge into the adjacent channel layers.

SUMMARY

The present disclosure is directed to various methods of manufacturing a gate-all-around (GAA) nanosheet (NS) field effect transistor (FET). In one embodiment, the method includes forming a stack on a substrate. The stack includes an alternating arrangement of conducting channel layers and non-uniform sacrificial regions. Each of the non-uniform sacrificial regions includes upper, middle, and lower sacrificial layers. The upper and lower sacrificial layers are configured to etch at a first etch rate and the middle sacrificial layer is configured to etch at a second etch rate greater than the first etch rate.

The method may also include-etching the stack to form electrode recesses, and performing a lateral etch on the non-uniform sacrificial regions. The lateral etch etches the middle sacrificial layer of each non-uniform sacrificial region to a greater extent than the upper and lower sacrificial layers of each non-uniform sacrificial region to form a pair of recesses between the upper and lower sacrificial layers of each non-uniform sacrificial region.

The method may also include epitaxially depositing first and second portions of source and drain electrodes. The first portions include a lateral extension filling in one of the recesses and a vertical extension extending along a sidewall. The method may also include removing the sacrificial regions to form upper and lower recess regions on opposite sides of each of the lateral extensions, and forming reverse inner spacers by depositing a dielectric material in the recesses. An unfilled gap may remain following the depositing of the dielectric material to form the reverse inner spacers, and the forming of the reverse inner spacers may also include removing portions of the dielectric material outside of the upper and lower recess regions. The dielectric material may include an oxide or a nitride. Each of the conducting channel layers may include silicon (Si).

The upper, middle, and lower sacrificial layers may each include silicon-germanium (SiGe), and a Ge % of the SiGe of the middle sacrificial layer may be greater than a Ge % of the SiGe of each of the upper and lower sacrificial layers. The Ge % of the middle layer may be greater than 40% and the Ge % of each of the upper and lower sacrificial layers may be less than 35%. The Ge % of the middle layer may be greater than 50% and the Ge % of each of the upper and lower sacrificial layers may be less than 30%.

A thickness of the middle sacrificial layer of each of the non-uniform sacrificial regions may be thinner than a thickness of each of the upper and lower sacrificial layers of each of the non-uniform sacrificial regions. A thickness of the middle sacrificial layer of each of the non-uniform sacrificial regions may be from approximately 1 nm to approximately 5 nm, and a thickness of the upper and lower sacrificial layers of each of the non-uniform sacrificial regions may be from approximately 3 nm to approximately 7 nm. A thickness of the middle sacrificial layer of each of the non-uniform sacrificial regions may be from approximately 2 nm to approximately 3 nm, and a thickness of the upper and lower sacrificial layers of each of the non-uniform sacrificial regions may be from approximately 3 nm to approximately 5 nm.

The method may also include forming a dummy gate stack and an external spacer on the stack, and the electrode recesses formed during the etching of the stack may be aligned with edges of the external spacer.

The present disclosure is also directed to various embodiments of a gate-all-around (GAA) nanosheet (NS) field effect transistor (FET). In one embodiment, the GAA NS FET includes a source electrode, a drain electrode, a series of channel regions extending between the source electrode and the drain electrode, a gate stack between the source electrode and the drain electrode and between two adjacent channel regions of the series of channel regions, and a pair of reverse inner spacers between the two adjacent channel regions. The source electrode and the drain electrode each include a first portion and a second portion. The first portion includes a vertical sidewall portion and a lateral extension portion extending from the vertical sidewall portion between the two adjacent channel regions. Each reverse inner spacer of the pair of reverse inner spacers includes a first inner spacer segment and a second inner spacer segment vertically spaced apart from the first inner spacer segment by one of the lateral extension portions of the source electrode or the drain electrode. The first and second inner spacer segments of each reverse inner spacer are adjacent to the vertical sidewall of one of the first portions of the source and drain electrodes.

Each of the source and drain electrodes may include a crystalline material substantially free of defects. The first portions of the source and drain electrodes may include undoped Si. The second portions of the source and drain electrodes may include doping.

The lateral extension portions may have a lateral length from approximately 2 nm to approximately 10 nm and a height from approximately 2 nm to approximately 6 nm.

Each of the first and second inner spacer segments may have a lateral length less than or substantially equal to the lateral length of the lateral extension portions, and a vertical spacing between the first and second inner spacer segments of each reverse inner spacer may be substantially equal to the height of the lateral extension portions.

Each of the reverse inner spacers may include a dielectric material such as an oxide material or a nitride material, and the dielectric material may have a K value from approximately 2 to approximately 8.

A vertical spacing between the two adjacent channel regions may be from approximately 8 nm to approximately 20 nm, a width of each of the two adjacent channel regions may be from approximately 6 nm to approximately 60 nm, and a thickness of each of the two adjacent channel regions may be from approximately 3 nm to approximately 8 nm.

The GAA NS FET may be an nMOS FET, a pMOS FET, or combinations thereof.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

The present disclosure is directed to various embodiments of gate-all-around (GAA) nanosheet (NS) field-effect transistors (FETs) and methods of manufacturing the same. The GAA NS FET architecture according to various embodiments of the present disclosure is configured to achieve source-drain (SD) stressor regions, low gate-drain capacitance (Cgd), multiple threshold voltages (mVt), and uniform or substantially uniform channel thicknesses. According to various embodiments of the present disclosure, dielectric internal spacers are formed after the epitaxial deposition of the source-drain electrodes, which results in low-defect source-drain electrodes and relatively low Cgd. Additionally, according to various methods of the present disclosure, the channel layers are separated by a vertical spacing (VSP) distance sufficient to define multiples cavities, and multiple dielectric internal spacers (or multiple dielectric spacer segments) are formed within the cavities of each of the VSPs to achieve multiple threshold voltages (mVt) with relatively low Cgd. According to various embodiments of the present disclosure, sacrificial regions having a non-uniform composition configured to etch with at least two different etch rates are utilized to achieve a greater undercut etch in middle portions of the sacrificial regions compared to upper and lower portions of the sacrificial regions prior to the epitaxial deposition of the SD electrodes (e.g., utilizing sacrificial regions having a non-uniform composition enables the lateral recess of only or substantially only the middle portions of the sacrificial regions prior to the epitaxial deposition of the SD electrodes). Utilizing sacrificial regions having non-uniform etch rates results in faster removal of the sacrificial regions during the etch of the sacrificial regions, which reduces the etching of exposed portions of the channel layers. Reducing the etch time of the sacrificial regions, which in turn reduces the etching of the exposed portions of the channel layers, results in the channel layers having a more uniform thickness and a more uniform composition compared to GAA NS FETs having channel layers formed utilizing conventional methods. Additionally, the lateral recessing of only (or substantially only) the middle portions of the sacrificial regions prior to the epitaxial deposition of the SD electrodes is filled in by a portion of the SD epitaxial material, rather than dielectric spacer material, which results in the formation of low-defect SD stressor regions.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
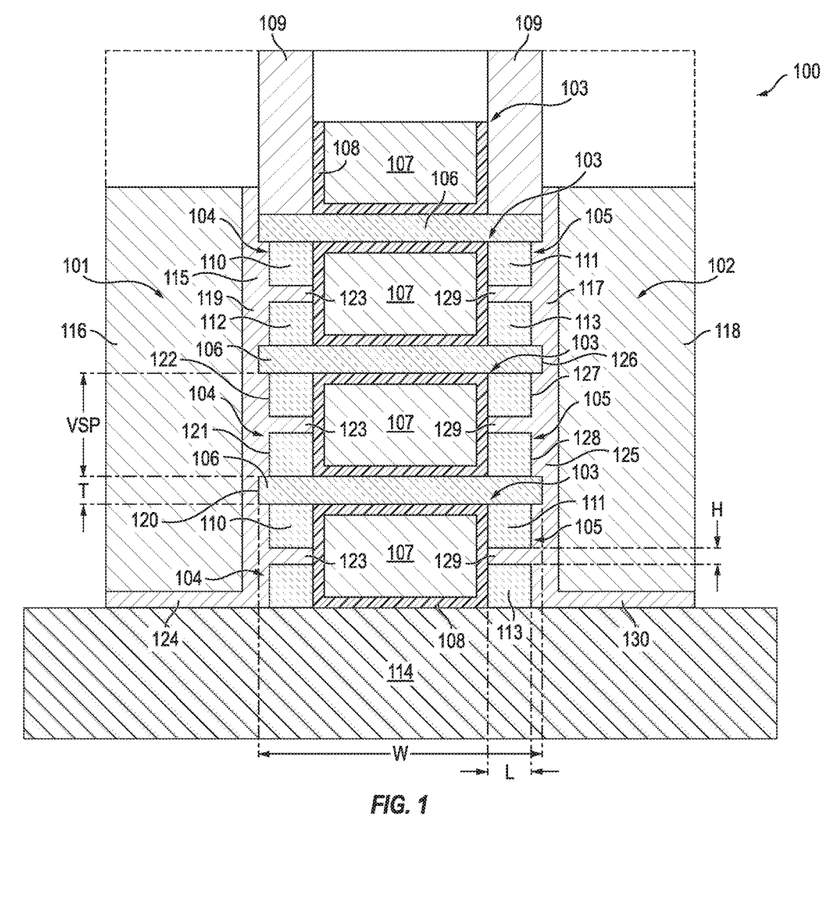
FIG. 1 is a schematic cross-sectional view of a gate-all-around (GAA) nanosheet (NS) field-effect transistor (FET) according to one embodiment of the present disclosure.

With reference now to FIG. 1, a gate-all-around (GAA) nanosheet (NS) field-effect transistor (FET) 100 (e.g., an nMOS device or a pMOS device) according to one embodiment of the present disclosure includes a source electrode 101, a drain electrode 102, a series of gate stacks 103 between the source electrode 101 and the drain electrode 102, a series of first reverse inner spacers 104 between the source electrode 101 and the gate stacks 103, a series of second reverse inner spacers 105 between the drain electrode 102 and the gate stacks 103, and a series of channel regions 106 under the gate stacks 103 and extending between the source electrode 101 and the drain electrode 102. In the illustrated embodiment, each of the gate stacks 103 includes a metal gate electrode 107 and a gate dielectric 108 (i.e., a gate dielectric layer or stack of gate dielectric layers), such as a high-k gate oxide layer and an interfacial layer. In the illustrated embodiment, the GAA NS FET also includes external spacers 109 on the uppermost channel layer 106 and at opposite sides of the uppermost gate stack 103.

In the illustrated embodiment, each of the reverse inner spacers 104, 105 includes a first inner spacer segment 110, 111 (e.g., an upper inner spacer segment) and a second inner spacer segment 112, 113 (e.g., a lower inner spacer segment) underneath the first inner spacer segment 110, 111, respectively. The first and second inner spacer segments 110, 111 and 112, 113 of the reverse inner spacers 104, 105 are formed of a dielectric material. In one or more embodiments, the dielectric material of the reverse inner spacers 104, 105 may be an oxide material or a nitride material having a K value in a range from approximately 2 to approximately 8 (e.g., a K value from approximately 3 to approximately 5). In one embodiment, the dielectric material is an oxide, such as silicon oxide, having a K value less than 4.

In one or more embodiments, the channel layers 106 are formed of silicon (Si). In one or more embodiments, the channel layers 106 may have a width W from approximately 6 nm to approximately 60 nm. In one or more embodiments, the channel layers 106 may each have a thickness T from approximately 3 nm to approximately 8 nm (e.g., approximately 4 nm to approximately 7 nm). In one or more embodiments, a vertical spacing VSP between adjacent channel layers 106 and between the lowermost channel layer 106 and a substrate 114 is from approximately 8 nm to approximately 20 nm (e.g., from approximately 9 nm to approximately 14 nm). Although in the illustrated embodiment there are three channel layers 106, in one or more embodiments, the number of channel layers 106 may be from two to six channel layers 106 (e.g., from two to four channel layers 106).

With continued reference to the embodiment illustrated in FIG. 1, the source electrode 101 includes a first source electrode region 115 and a second source electrode region 116, and the drain electrode 102 includes a first drain electrode region 117 and a second drain electrode region 118. In the illustrated embodiment, the first source electrode region 115 includes a vertical portion 119 extending along vertical surfaces 120, 121, 122 of the channel layers 106 and the first and second inner spacer segments 110, 112 of the first reverse inner spacers 104, respectively, and a series of lateral extensions 123 extending inward from the vertical portion 119. The lateral extensions 123 of the first source electrode region 115 extend between the first and second inner spacer segments 110, 112 of the first reverse inner spacers 104 (i.e., the lateral extensions 123 of the first source electrode region 115 vertically separate the first and second inner spacer segments 110, 112 of each of the first reverse inner spacers 104). In the illustrated embodiment, the first source electrode region 115 also includes a horizontal portion 124 extending outward from the vertical portion 119 along the substrate 114 (i.e., a horizontal portion 124 vertically separating the second source electrode region 116 from the substrate 114).

In the illustrated embodiment, the first drain electrode region 117 includes a vertical portion 125 extending along vertical surfaces 126, 127, 128 of the channel layers 106 and the first and second inner spacer segments 111, 113 of the second reverse inner spacers 105, respectively, and a series of lateral extensions 129 extending inward from the vertical portion 125. The lateral extensions 129 of the first drain electrode region 117 extend between the first and second inner spacer segments 111, 113 of the second reverse inner spacers 105 (i.e., the lateral extensions 129 of the first drain electrode region 117 vertically separate the first and second inner spacer segments 111, 113 of each of the second reverse inner spacers 105). In the illustrated embodiment, the first drain electrode region 117 also includes a horizontal portion 130 extending outward from the vertical portion 125 along the substrate 114 (i.e., a horizontal portion 130 vertically separating the second drain electrode region 118 from the substrate 114). In one or more embodiments, the first source electrode region 115 and the first drain electrode region 117 may each include undoped Si and the second source electrode region 116 and the second drain electrode region 118 may each include doped Si. In one or more embodiments, the first source electrode region 115 and the first drain electrode region 117 may be formed of the same material as the channel layers 106 (e.g., the first source electrode region 115 and the first drain electrode region 117 may be formed of undoped Si).

In one or more embodiments, a lateral length L (e.g., a horizontal length) of each of the lateral extensions 123, 129 may be from approximately 2 nm to approximately 10 nm (e.g., approximately 4 nm to approximately 8 nm). Additionally, a vertical height (i.e., a thickness) H of each of the lateral extensions 123, 129 may be from approximately 2 nm to approximately 6 nm (e.g., from approximately 2 nm to approximately 4 nm).

In one or more embodiments, the GAA NS FET 100 may include one or more additional layers of epitaxial source-drain material. In one or more embodiments, the GAA NS FET 100 may be an nMOS FET and/or a pMOS FET. In one or more embodiments in which the GAA NS FET 100 is an nMOS FET, the one or more additional layers of epitaxial source-drain material may include Si, SiP, SiCP, $Si_3P_4$, or combinations thereof, and the one or more additional layers of epitaxial source-drain material may impart a component of tensile strain to the channel layers 106. In one or more embodiments, the one or more additional layers of epitaxial source-drain material may be formed of Si or SiGe, and at least a portion of the one or more additional layers of epitaxial source-drain material may have a Ge % greater than the Ge % of the channel layers 106 such that the one or more additional layers of epitaxial source-drain material impart a component of compressive strain to the channel layers 106. In one or more embodiments, at least a portion of each of the source and drain electrodes 101, 102 acts as a stressor imparting a strain to the channel layers 106.

Figure 2A:
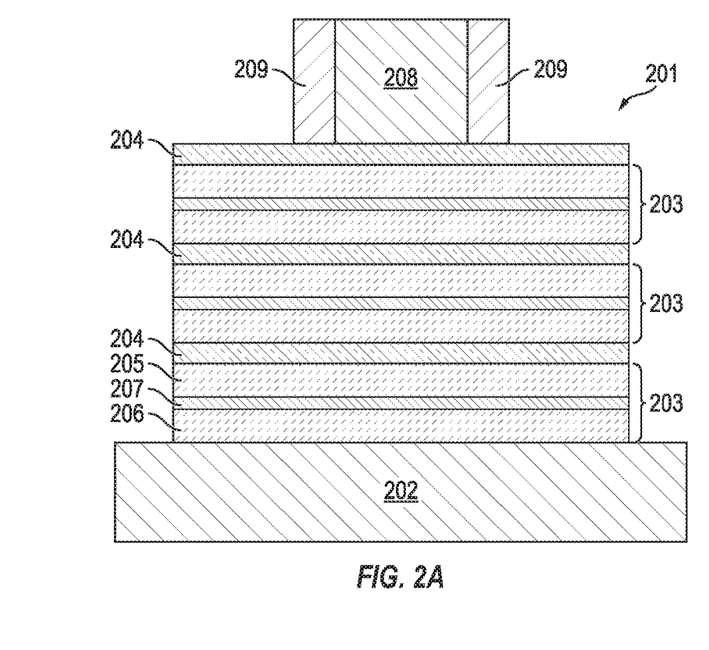
FIGS. 2A-2H depict tasks of a method of forming a GAA NS FET according to one embodiment of the present disclosure.

FIGS. 2A-2H depict tasks of a method of forming a gate-all-around (GAA) nanosheet field-effect transistor (FET) device 200 (see FIG. 2H) according to one embodiment of the present disclosure. As illustrated in FIG. 2A, the method of forming the GAA nanosheet FET 200 (see FIG. 2H) according to one embodiment includes forming or obtaining an initial stack 201 on an underlayer or substrate 202. In one or more embodiments, the substrate 202 may be a bulk Si substrate, a strain relaxed buffer (SRB), or a SOI substrate. In the illustrated embodiment, the initial stack 201 includes an alternating arrangement of non-uniform sacrificial regions 203 and channel layers 204. In the illustrated embodiment, the lowermost non-uniform sacrificial region 203 is directly on the substrate 202. In one or more embodiments, the channel layers 204 may be formed of silicon (Si).

In the illustrated embodiment, each of the non-uniform sacrificial regions 203 includes an upper sacrificial layer 205, a lower sacrificial layer 206, and a middle sacrificial layer 207 between the upper and lower sacrificial layers 205, 206. The upper and lower sacrificial layers 205, 206 are configured to etch at a first etch rate and the middle sacrificial layer 207 is configured to etch at a second etch rate greater than the first etch rate. In one or more embodiments, the upper, middle, and lower sacrificial layers 205, 206, 207 may each include silicon-germanium (SiGe). Additionally, in one or more embodiments, the greater etch rate of the middle sacrificial layer 207 compared to the upper and lower sacrificial layers 205, 206 may be achieved by providing a higher Ge % in the SiGe of the middle sacrificial layer 207 than the Ge % in the SiGe of each of the upper and lower sacrificial layers 205, 206. In one or more embodiments, the middle sacrificial layer 207 may include SiGe having a Ge % greater than approximately 40 atomic percent (40 at %) (e.g., greater than approximately 50 at %) and the upper and lower sacrificial layers 205, 206 may each include SiGe having a Ge % less than approximately 35 at % (e.g., less than approximately 30 at %). In one or more embodiments, the middle sacrificial layer 207 may be thinner than each of the upper and lower sacrificial layers 205, 206. In one embodiment, the middle sacrificial layer 207 of each non-uniform sacrificial region 203 may have a thickness from approximately 1 nm to approximately 5 nm (e.g., from approximately 2 nm to approximately 3 nm) and each of the upper and lower sacrificial layers 205, 206 of each non-uniform sacrificial region 203 may have a thickness from approximately 3 nm to approximately 7 nm (e.g., from approximately 3 nm to approximately 5 nm).

In one or more embodiments, a vertical spacing (VSP) between adjacent channel layers 204 and between the substrate 202 and the lowermost channel layer 204 (e.g., a thickness of the non-uniform sacrificial regions 203) is from approximately 8 nm to approximately 20 nm (e.g., from approximately 9 nm to approximately 14 nm). In one or more embodiments, the number of channel layers 204 in the initial stack 201 may be from two to six channel layers 204 (e.g., from two to four channel layers 204). In one or more embodiments, the channel layers 204 may have a width from approximately 6 nm to approximately 60 nm. In one or more embodiments, the channel layers 204 may each have a thickness from approximately 3 nm to approximately 8 nm (e.g., approximately 4 nm to approximately 7 nm).

Although in the illustrated embodiment the initial stack 201 includes three non-uniform sacrificial regions 203 and three channel layers 204, in one or more embodiments, the initial stack 201 may include any other suitable number of non-uniform sacrificial regions 203 and channel layers 204 depending on the desired size of the GAA nanosheet FET 200.

With continued reference to the embodiment illustrated in FIG. 2A, the method of forming the GAA nanosheet FET 200 according to one embodiment of the present disclosure includes a task of forming a dummy gate stack 208 and external spacers 209 on the initial stack 201 (e.g., forming a dummy gate stack 208 and a pair of external spacers 209 on opposite sides of the dummy gate stack 208 on the uppermost channel layer 204 of the initial stack 201). The dummy gate stack 208 and the external spacers 209 may be formed by any manufacturing technique or process known in the art or hereinafter developed.

Figure 2B:
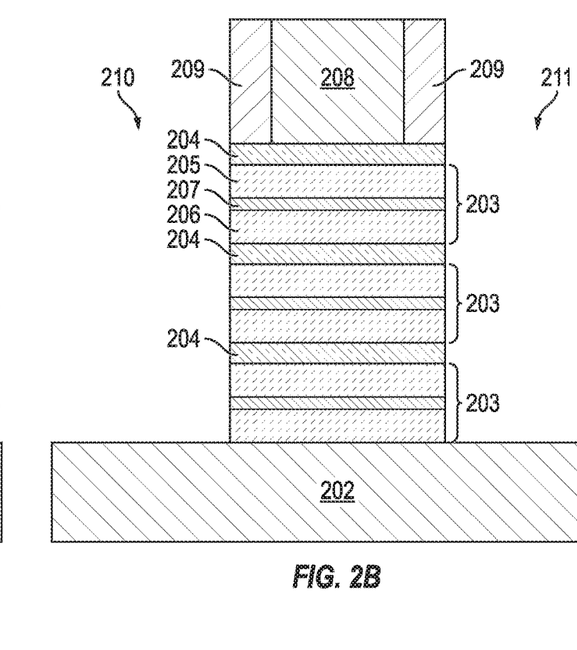

With reference now to FIG. 2B, the method of forming the GAA nanosheet FET 200 according to one embodiment of the present disclosure includes a task of deep etching portions of the initial stack 201 (e.g., etching to remove portions of the non-uniform sacrificial regions 203 and channel layers 204) to form electrode recesses 210, 211 for a source electrode and a drain electrode, respectively. In the illustrated embodiment, the portions of the initial stack 201 that are etched away are located laterally outside of the external spacers 209 deposited on top of the initial stack 201, which were formed as described above with reference to the task depicted in FIG. 2A. Although in the illustrated embodiment the electrode recesses 210, 211 are laterally aligned with edges of the external spacers 209, in one or more embodiments, the electrode recesses 210, 211 may not be laterally aligned with the edges of the external spacers 209. For instance, in one or more embodiments, the electrode recesses 210, 211 may extend underneath at least a portion of the external spacers 209. Following the task of deep etching the initial stack 201, remaining portions of the non-uniform sacrificial regions 203 and the channel layers 204 underneath the dummy gate stack 208 and the external spacers 209 are alternately arranged in a stack.

Figure 2C:
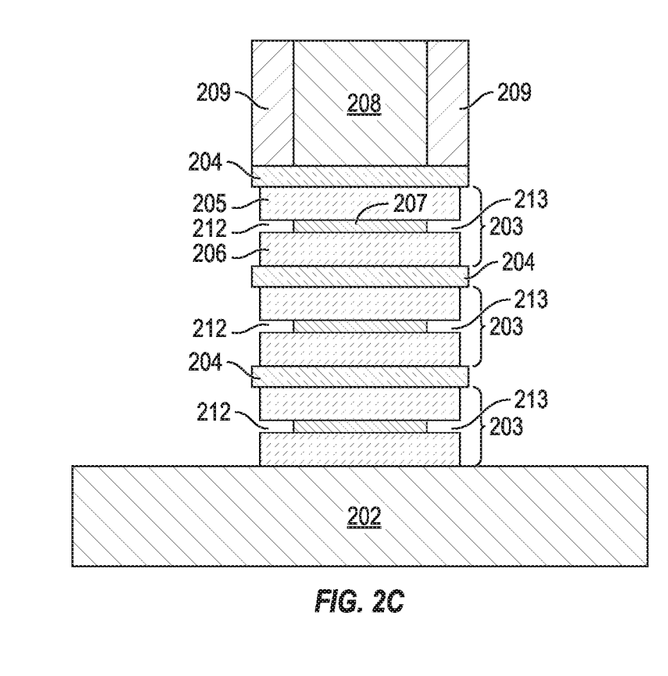

With reference now to FIG. 2C, the method of forming the GAA nanosheet FET 200 according to one embodiment of the present disclosure includes a task of laterally etching opposite sides of each of the non-uniform sacrificial regions 203 facing the electrode recesses 210, 211 (e.g., performing a lateral etch-back of each of the non-uniform sacrificial regions 203). During the task of laterally etching the non-uniform sacrificial regions 203, opposite sides of the middle sacrificial layers 207 are removed to a greater extent than opposite sides of the upper and lower sacrificial layers 205, 206 due to the greater etch rate of the middle sacrificial layers 207 compared to the upper and lower sacrificial layers 205, 206 (e.g., due to the greater Ge % in the SiGe of the middle sacrificial layer 207 compared to the Ge content in the SiGe of the upper and lower sacrificial layers 205, 206). Additionally, during the lateral etch of the non-uniform sacrificial regions 203, the channel layers 204 are not etched or substantially not etched (e.g., the channel layers 204 remain intact during the lateral etching of the non-uniform sacrificial regions 203). Following the task of etching the non-uniform sacrificial regions 203, the channel regions 204 and the upper and lower sacrificial layers 205, 206 extend beyond (e.g., overhang) the middle sacrificial layers 207. Accordingly, for each non-uniform sacrificial region 203, a pair of intermediate lateral cavities 212, 213 (i.e., middle lateral recesses) are formed at opposite sides of the middle sacrificial layer 207 between the upper and lower sacrificial layers 205, 206 following the task of etching the non-uniform sacrificial regions 203. In the illustrated embodiment, the intermediate lateral cavities 212, 213 are in communication with the electrode recesses 210, 211, respectively. The middle sacrificial layers 207 of the non-uniform sacrificial regions 203 may be recessed to any suitable depth. For example, in one or more embodiments, the opposite ends of the middle sacrificial layers 207 of the non-uniform sacrificial regions 203 may each be recessed by approximately 2 nm to approximately 10 nm (e.g., approximately 4 nm to approximately 8 nm).

Figure 2D:
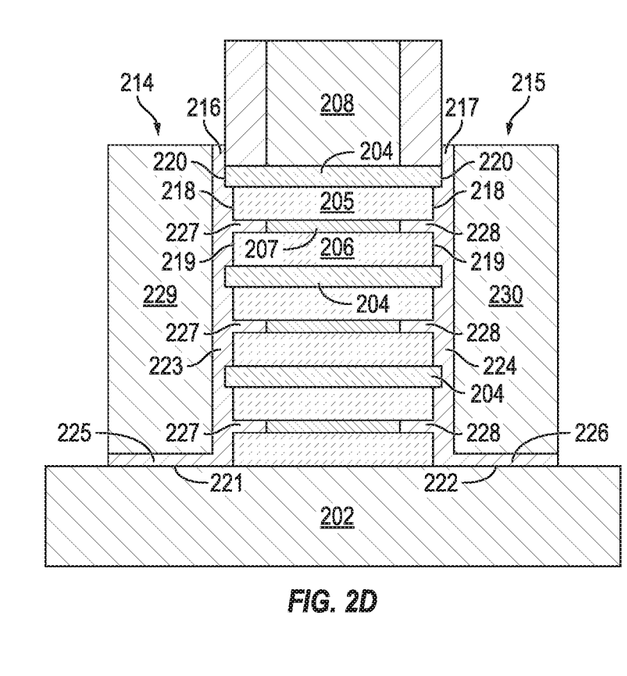

With reference now to FIG. 2D, the method of forming the GAA nanosheet FET 200 according to one embodiment of the present disclosure includes a task of epitaxially re-growing a source electrode and a drain electrode 214, 215 in the electrode recesses 210, 211, respectively, formed during the task of deep etching portions of the initial stack 201, as described above with reference to the task depicted in FIG. 2B. In the illustrated embodiment, the task of epitaxially re-growing the source and drain electrodes 214, 215 includes a task of epitaxially re-growing a first portion 216, 217 of each of the source and drain electrodes 214, 215, respectively. During this task, the first portions 216, 217 of the source and drain electrodes 214, 215, respectively, fill or substantially fill the intermediate lateral cavities 212, 213 formed in each of the non-uniform sacrificial regions 203 during the task of laterally etching the non-uniform sacrificial regions 203, as described above with reference to FIG. 2C. Additionally, during this task, the first portions 216, 217 of the source and drain electrodes 214, 215 form along vertical side surfaces 218, 219, 220 (e.g., vertical sidewalls) of the upper and lower sacrificial layers 205, 206 and the channel layers 204 facing the electrode recesses 210, 211. The first portions 216, 217 of the source and drain electrodes 214, 215 may also form along the substrate 202 during this task. That is, during the task of epitaxially regrowing the source and drain electrodes 214, 215, the first portions 216, 217 of the source and drain electrodes 214, 215 are grown from multiple surfaces, including the vertical side surfaces 218, 219, 220 of the upper and lower sacrificial layers 205, 206 and the channel layers 204 facing the electrode recesses 210, 211, exposed surfaces 221, 222 of the substrate 202 at the bottoms of the electrode recesses 210, 211, respectively, and surfaces of the upper and lower sacrificial layers 205, 206 and the middle sacrificial layer 207 facing the intermediate lateral cavities 212, 213. Accordingly, the first portions 216, 217 of the source and drain electrodes 214, 215 formed during this task each include a vertical portion 223, 224, respectively, extending along the vertical surfaces 218, 219, 220 of the upper and lower sacrificial layers 205, 206 and the channel layers 204 facing the electrode recesses 210, 211, a horizontal portion 225, 226, respectively, extending outward from the vertical portion 223, 224 along the substrate 202, and a series of lateral extensions 227, 228, respectively, extending inward from the respective vertical portion 223, 224 into the respective intermediate lateral cavities 212, 213 formed in each of the non-uniform sacrificial regions 203.

The lateral extensions 227, 228 have a lateral length corresponding or substantially corresponding to the depth to which the middle sacrificial layers 207 were etched during the task of laterally etching the non-uniform sacrificial regions 203 described above in reference to FIG. 2C. In one or more embodiments, the lateral length of each of the lateral extensions 227, 228 may be from approximately 2 nm to approximately 10 nm (e.g., approximately 4 nm to approximately 8 nm). Additionally, the lateral extensions 227, 228 have a vertical height (i.e., a thickness) corresponding or substantially corresponding to the thickness of the middle sacrificial layers 207. In one or more embodiments, the thickness of each of the lateral extensions 227, 228 may be from approximately 2 nm to approximately 6 nm (e.g., from approximately 2 nm to approximately 4 nm). In one or more embodiments, the first portions 216, 217 of the source and drain electrodes 214, 215 may be formed of the same material as the channel layers 204 (e.g., the first portions 216, 217 of the source and drain electrodes 214, 215 may be formed of undoped Si). In one or more embodiments, the first portions 216, 217 of the source and drain electrodes 214, 215 may be formed of Si, formed substantially of Si, or formed of a higher Si % than the sacrificial layers 205, 206, 207 of the non-uniform sacrificial regions 203.

With continued reference to the embodiment illustrated in FIG. 2D, the method also includes a task of epitaxially re-growing a second portion 229, 230 of each of the source and drain electrodes 214, 215, respectively, following the task of epitaxially re-growing the first portions 216, 217 of the source and drain electrodes 214, 215.

In one or more embodiments, the GAA nanosheet FET 200 may be an nMOS FET and/or a pMOS FET. In one or more embodiments in which the GAA nanosheet FET 200 is an nMOS FET, the task of epitaxially re-growing second portions 229, 230 of each of the source and drain electrodes 214, 215 may include Si, SiP, SiCP, $Si_3P_4$, or combinations thereof, and the second portions 229, 230 may impart a component of tensile strain to the channel layers 204. In one or more embodiments in which the GAA nanosheet FET 200 is a pMOS FET, the task of epitaxially re-growing second portions 229, 230 of each of the source and drain electrodes 214, 215 may include Si or SiGe, and at least a portion of the second portions 229, 230 may have a Ge % greater than the Ge % of the channel layers 204 such that second portions 229, 230 impart a component of compressive strain to the channel layers 204. In one or more embodiments, at least a portion of each of the source and drain electrodes 214, 215 acts as a stressor imparting a strain to the channel layers 204.

Figure 2E:
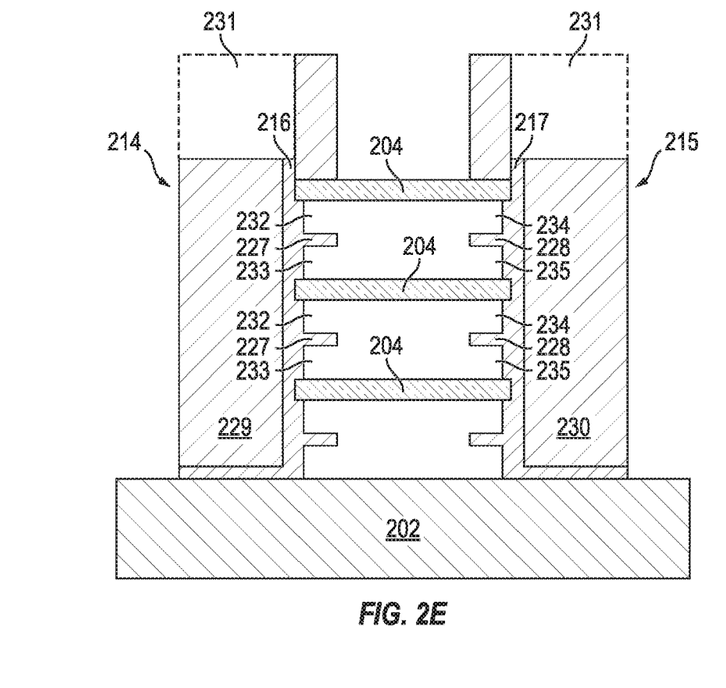

With reference now to the embodiment illustrated in FIG. 2E, the method includes tasks of depositing an interlayer dielectric (ILD) 231 on the source and drain electrodes 214, 215, performing chemical mechanical planarization (CMP) to a top of the dummy gate stack 208, and then removing the dummy gate stack 208. With continued reference to FIG. 2E, the method also includes a task of removing the remaining portions of the non-uniform sacrificial regions 203 (i.e., removing the remaining portions of the upper, middle, and lower sacrificial layers 205, 207, 206 of each non-uniform sacrificial region 203) by wet or dry etch that is selective with respect to the channel layers 204 and the first portions 216, 217 of the source and drain electrodes 214, 215 (e.g., an etch selective with respect to the Si channel layers 204 and the first portions 216, 217 of the source and drain electrodes 214, 215). In one or more embodiments, the selective etching of the non-uniform sacrificial regions 203 will not etch into the channel layers 204 or the first portions 216, 217 of the source and drain electrodes 214, 215 because these regions are formed of Si. Following the task of removing the remaining portions of the non-uniform sacrificial regions 203, a pair of upper and lower recesses 232, 233 and 234, 235 are formed above and below the lateral extensions 227, 228, respectively, of the first portions 216, 217 of the source and drain electrodes 214, 215 (i.e., each region defined between two adjacent channel layers 204 or between the lowermost channel layer 204 and the substrate 202 includes a left pair of upper and lower recesses 232, 233 above and below one of the lateral extensions 227 of the source electrode 214, and a right pair of upper and lower recesses 234, 235 above and below one of the lateral extensions 228 of the drain electrode 215).

Figure 2F:
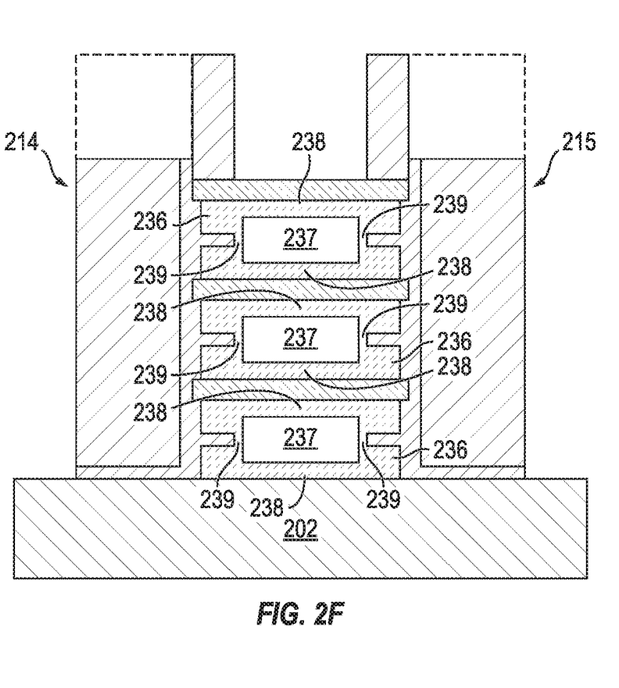

With reference now to the embodiment illustrated in FIG. 2F, the method includes a task of forming (e.g., depositing) a dielectric material 236 to fill or substantially fill each of the upper and lower recesses 232, 233, 234, 235 formed following the task of removing the remaining portions of the non-uniform sacrificial regions 203, as described above in reference to FIG. 2E. The dielectric material may be an oxide material or a nitride material having a K value in a range from approximately 2 to approximately 8 (e.g., from approximately 3 to approximately 5). In one embodiment, the dielectric material 236 is an oxide, such as silicon oxide, having a K value less than 4. In the illustrated embodiment, following the task of depositing the dielectric material 236 in the upper and lower recesses 232, 233, 234, 235, unfilled gaps 237 (e.g., voids or cavities 237 not containing the dielectric material 236) remain. In the illustrated embodiment, the unfilled gaps 237 are defined laterally between innermost ends of the lateral extensions 227, 228 and vertically between adjacent channel layers 204 (or between the lowermost channel layer 204 and the substrate 202). In the illustrated embodiment, during the task of depositing the dielectric material 236, thin layers 238 of the dielectric material form horizontally along the channel layers 204 and the substrate 202 such that the unfilled gap 237 does not extend vertically all the way to the channel layers 204 or the substrate 202. Additionally, in the illustrated embodiment, during the task of depositing the dielectric material 236, thin layers 239 of the dielectric material 236 form vertically along the innermost ends of the lateral extensions 227, 228 such that the unfilled gap 237 does not extend horizontally all the way to the innermost ends of the lateral extensions 227, 228. Together, the thin horizontal and vertical layers 238, 239 of the dielectric material 236 form a picture frame around each of the unfilled gaps 237.

Figure 2G:
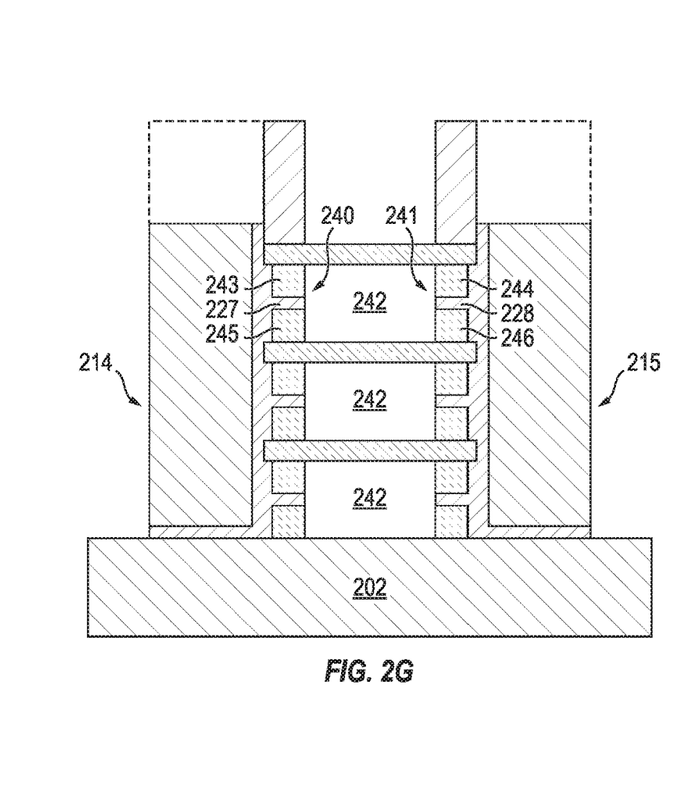

With reference now to FIG. 2G, the method of forming the GAA nanosheet FET 200 according to one embodiment of the present disclosure includes a task of forming reverse inner spacers 240, 241 in the upper and lower recesses 232, 233, 234, 235 formed following the task of removing the remaining portions of the non-uniform sacrificial regions 203, as described above in reference to FIG. 2E. In the illustrated embodiment, the reverse inner spacers 240, 241 are formed by removing all portions or substantially all portions of the dielectric material 236 that are not formed in the upper and lower recesses 232, 233, 234, 235 (i.e., the reverse inner spacers 240, 241 are formed by the portions of the dielectric material formed (e.g., deposited) in the upper and lower recesses 232, 233, 234, 235). In the illustrated embodiment, this task of removing portions of the dielectric material 236 removes the thin layers 238 of dielectric material 236 extending horizontally along the channel layers 204 and the substrate 202 and the thin layers 239 of dielectric material 236 extending vertically along the innermost ends of the lateral extensions 227, 228 (i.e., this task removes the picture frame around each of the unfilled gaps 237). Removing these portions 238, 239 of the dielectric material 236 forms a series of gate stack cavities 242 defined laterally between the innermost ends of the lateral extensions 227, 228 and vertically between adjacent channel layers 204 (or between the lowermost channel layer 204 and the substrate 202). Accordingly, following this task of removing portions 238, 239 of the dielectric material 236, the dielectric material 236 remains only in (or substantially only in) the upper and lower recesses 232, 233, 234, 235 defined above and below each of the lateral extensions 227, 228 of the source and drain electrodes 214, 215. In the illustrated embodiment, each of the reverse inner spacers 240, 241 includes an upper inner spacer segment 243, 244 and a lower inner spacer segment 245, 246, respectively, with the lower inner spacer segment 245, 246 spaced vertically apart from the respective upper inner spacer segment 243, 244 by one of the lateral extensions 227, 228 of the source and drain electrodes 214, 215.

Each of the upper and lower inner spacer segments 243, 244, 245, 246 has a lateral length that is less than or equal to the lateral length of the corresponding lateral extension 227, 228 of the source and drain electrodes 214, 215. In one or more embodiments, the lateral length of each of the upper and lower inner spacer segments 243, 244, 245, 246 may be from approximately 2 nm to approximately 10 nm (e.g., approximately 4 nm to approximately 8 nm). Additionally, the upper and lower inner spacer segments 243, 244, 245, 246 of each reverse inner spacer 240, 241 are vertically separated by a distance equal or substantially equal to the thickness of the corresponding lateral extension 227, 228. In one or more embodiments, the distance vertically separating the upper and lower inner spacer segments 243, 244, 245, 246 of each reverse inner spacer 240, 241 may be from approximately 2 nm to approximately 6 nm (e.g., approximately 2 nm to approximately 4 nm). In one or more embodiments, the method may include one or more tasks of densification of the reverse inner spacers 240, 241 (i.e., densification of the upper and lower inner spacer segments 243, 244, 245, 246 of the reverse inner spacers 240, 241). The one or more tasks of densification of the reverse inner spacers 240, 241 may include any suitable process or processes, such as, for instance, a thermal process.

Figure 2H:
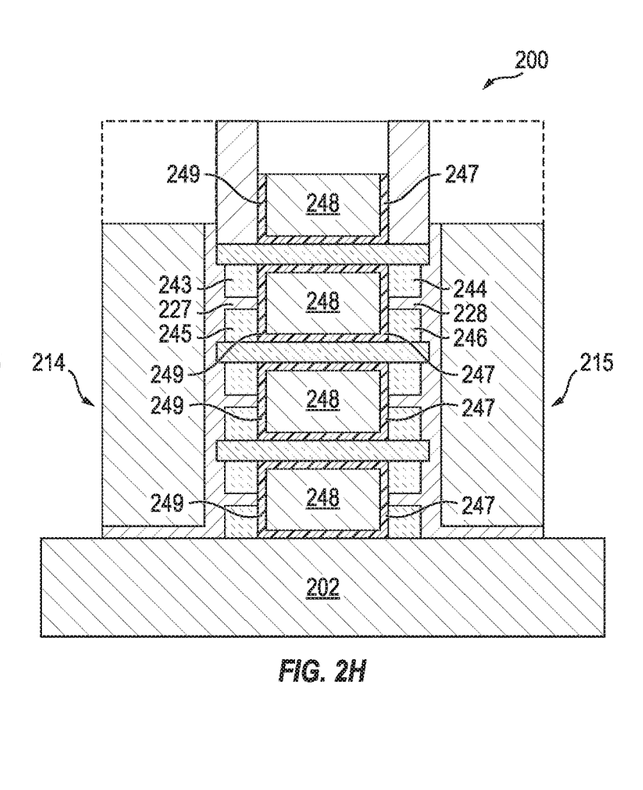

With reference now to FIG. 2H, the method of forming the GAA nanosheet FET 200 according to one embodiment of the present disclosure also includes a task of forming or depositing a gate stack 247 including a metal gate electrode 248 and a gate dielectric 249 (i.e., a gate dielectric layer or stack of gate dielectric layers), such as a Hi-k gate oxide layer and an interfacial layer, in each of the gate stack cavities 242. In the illustrated embodiment, the metal gate 248 electrode of each gate stack 247 may be adjacent or substantially adjacent to the corresponding gate dielectric 249. The gate stacks 247 extend laterally between the reverse inner spacers 240, 241 and the lateral extensions 227, 228 vertically separating the upper and lower inner spacer segments 243, 244, 245, 246 of each reverse inner spacer 240, 241. The gate stacks 247 extend vertically between adjacent channel layers 204 or between the lowermost channel layer 204 and the substrate 202. The task of forming or depositing the gate stacks 247 including the metal gate electrodes 248 and the gate dielectrics 249 may be performed by any suitable replacement metal gate (RMG) process now known or hereinafter developed. Following the task of forming the gate stacks 247, the reverse inner spacers 240, 241 separate the metal gate electrodes 248 from the source and drain electrodes 214, 215, which results in a lower gate-drain capacitance (Cgd).

The method also includes completing formation of the GAA NS FET 200 and a circuit including one or more of the GAA NS FETs 200 by tasks known in the art, including CMP tasks to enable gate metal only in the removed dummy gate regions, followed by a task of contact formation, and a task of back-end-of-line (BEOL) formation. Additionally, in one or more embodiments, the method may include forming partial gate-all-around (GAA) FETs, conventional full GAA FETs, and/or conventional finFETs on the same chip/circuit as the GAA NS FET 200 formed according to the tasks of the present disclosure described above.

What is claimed is:

1. A gate-all-around (GAA) nanosheet (NS) field effect transistor (FET) comprising:
   a source electrode;
   a drain electrode;
   a plurality of channel regions extending between the source electrode and the drain electrode;
   a gate stack between the source electrode and the drain electrode and between two adjacent channel regions of the plurality of channel regions; and
   a pair of reverse inner spacers between the two adjacent channel regions,
   wherein the source electrode and the drain electrode each comprise a first portion and a second portion, the first portion comprising a vertical sidewall portion and a lateral extension portion extending from the vertical sidewall portion between the two adjacent channel regions,
   wherein each reverse inner spacer of the pair of reverse inner spacers comprises a first inner spacer segment and a second inner spacer segment vertically spaced apart from the first inner spacer segment by one of the lateral extension portions of the source electrode or the drain electrode, and
   wherein the first and second inner spacer segments of each reverse inner spacer are adjacent to the vertical sidewall of one of the first portions of the source and drain electrodes.

2. The GAA NS FET of claim 1, wherein each of the source and drain electrodes comprises a crystalline material substantially free of defects.

3. The GAA NS FET of claim 1, wherein the first portions of the source and drain electrodes comprise undoped Si.

4. The GAA NS FET of claim 1, wherein the second portions of the source and drain electrodes include doping.

5. The GAA NS FET of claim 1, wherein the lateral extension portions have a lateral length from approximately 2 nm to approximately 10 nm and a height from approximately 2 nm to approximately 6 nm.

6. The GAA NS FET of claim 5, wherein each of the first and second inner spacer segments has a lateral length less than or substantially equal to the lateral length of the lateral extension portions, and wherein a vertical spacing between the first and second inner spacer segments of each reverse inner spacer is substantially equal to the height of the lateral extension portions.

7. The GAA NS FET of claim 1, wherein the each of the reverse inner spacers comprises a dielectric material selected from the group of materials consisting of an oxide material and a nitride material, and wherein the dielectric material has a K value from approximately 2 to approximately 8.

8. The GAA NS FET of claim 1, wherein:
a vertical spacing between the two adjacent channel regions is from approximately 8 nm to approximately 20 nm,
a width of each of the two adjacent channel regions is from approximately 6 nm to approximately 60 nm, and
a thickness of each of the two adjacent channel regions is from approximately 3 nm to approximately 8 nm.

9. The GAA NS FET of claim 1, wherein the GAA NS FET is selected from the group consisting of an nMOS FET, a pMOS FET, or combinations thereof.

* * * * *